(12) United States Patent  
Trancik et al.

(10) Patent No.: US 8,901,024 B2  
(45) Date of Patent: Dec. 2, 2014

(54) OZONE-TREATED CARBON ELECTRODES

(75) Inventors: Jessika E. Trancik, Santa Fe, NM (US); James C. Hone, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 1013 days.

(21) Appl. No.: 12/221,462

(22) Filed: Aug. 1, 2008

(65) Prior Publication Data

US 2009/0038681 A1 Feb. 12, 2009

Related U.S. Application Data

(60) Provisional application No. 60/962,989, filed on Aug. 2, 2007.

(51) Int. Cl.

| | |
|---|---|
| *B01J 38/12* | (2006.01) |
| *H01M 4/88* | (2006.01) |
| *H01L 31/00* | (2006.01) |
| *H01L 21/00* | (2006.01) |
| *B05D 5/12* | (2006.01) |
| *H01M 4/587* | (2010.01) |
| *H01G 9/20* | (2006.01) |
| *H01L 51/44* | (2006.01) |

(52) U.S. Cl.  
CPC .............. *H01G 9/2022* (2013.01); *H01M 4/587* (2013.01); *H01G 9/2059* (2013.01); *Y02E 10/542* (2013.01); *H01L 51/444* (2013.01); *H01G 9/2031* (2013.01)  
USPC ............... 502/38; 502/101; 136/256; 438/57; 427/74

(58) Field of Classification Search  
USPC ......... 136/256, 252; 427/74, 77; 429/40, 209; 204/242, 400; 977/750; 423/447, 423/447.1, 460, 449.5; 502/38, 51, 101; 438/57  
See application file for complete search history.

(56) References Cited

U.S. PATENT DOCUMENTS

| | | | |
|---|---|---|---|
| 5,272,017 A | 12/1993 | Swathirajan et al. | |
| 6,299,761 B1 * | 10/2001 | Wang | 210/87 |
| 7,157,788 B2 * | 1/2007 | Murofushi et al. | 257/643 |
| 2005/0148174 A1 * | 7/2005 | Unger et al. | 438/678 |
| 2008/0031802 A1 * | 2/2008 | Ma et al. | 423/447.1 |

FOREIGN PATENT DOCUMENTS

| | | | | |
|---|---|---|---|---|
| JP | 2004146255 | * | 5/2004 | H01M 4/96 |
| WO | WO 2006/135439 | * | 12/2006 | C01B 31/00 |

OTHER PUBLICATIONS

Endo, E. et al., English abstract of JP 2004146255, May 20, 2004.*  
Toebes, Marjolein L. et al., "The influence of oxidation on the texture and the number of oxygen-containing surface groups of carbon nanofibers", Oct. 2003, Elsevier Ltd., Carbon 42, pp. 307-315.*

(Continued)

*Primary Examiner* — Tamir Ayad  
(74) *Attorney, Agent, or Firm* — Schwegman Lundberg & Woessner, P.A.

(57) ABSTRACT

Ozone treated carbon electrodes can provide increased catalytic activity, such as in a dye-sensitized solar cell (DSSC) or other electrochemical device or other device that could benefit from an increased catalytic activity, such as lithium ion or other batteries, hydrogen fuel cells, or electroanalytical instruments. Devices, methods of making, and methods of using are discussed.

16 Claims, 17 Drawing Sheets  
(10 of 17 Drawing Sheet(s) Filed in Color)

(56) References Cited

OTHER PUBLICATIONS

Mawhinney, Douglas B. et al., "Infrared Spectral Evidence for the Etching of Carbon Nanotubes: Ozone Oxidation at 298 K", 2000, Journal of American Chemical Society, 122, pp. 2382-2384.*

Hernandez, Eduardo et al., Review of "Carbon Nanotubes and Related Structures: New Materials for the Twenty-First Century", Mar. 2004, Am. J. Phys., vol. 72, No. 3, p. 415.*

Wang, Zhen-Bo et al., "Effects of ozone treatment of carbon support on Pt-Ru/C catalysts performance for direct methanol fuel cell", Aug. 18, 2005, Carbon 44, pp. 133-140.*

Banks, C. E., et al., "Electrocatalysis at graphite and carbon nanotube modified electrodes: edge-plane sites and tube ends are the reactive sites", *Chem. Commun.*, (Feb. 21, 2005), 829-841.

Britto, P. J., et al., "Improved Charge Transfer at Carbon Nanotube Electrodes", *Advanced Materials*, 11(2), (1999), 154-157.

Hata, K., et al., "Water-Assisted Highly Efficient Synthesis of Impurity-Free Single-Walled Carbon Nanotubes", *Science*, 306, (2004), 1362-1364.

Hecht, D., et al., "Conductivity scaling with bundle length and diameter in single walled carbon nanotube networks", *Applied Physics Letters*, 89(13), (2006), 133112-1-133112-3.

Hu, L., et al., "Percolation in Transparent and Conducting Carbon Nanotube Networks", *Nano Letters*, 4(12), (2004), 2513-2517.

Simmons, J. M., et al., "Effect of Ozone Oxidation on Single-Walled Carbon Nanotubes", *J. Phys. Chem. B*, 110(14), (2006), 7113-7118.

Suzuki, K., et al., "Application of Carbon Nanotubes to Counter Electrodes of Dye-sensitized Solar Cells", *Chemistry Letters*, 32(1), (2003), 28-29.

Trancik, J. E., et al., "Transparent and Catalytic Carbon Nanotube Films", *Nano Letters*, 8(4), (2008), 982-987.

Wu, Z., et al., "Transparent, Conductive Carbon Nanotube Films", *Science*, 305(5688), (2004), 1273-1276.

Zhou, Y., et al., "A method of printing carbon nanotube thin films", *Applied Physics Letters*, 88, (2006), 123109-1-123109-3.

"Machine Translation of JP-2004-146255A", 17 pgs.

* cited by examiner

OZONE-TREATED CARBON ELECTRODES

CLAIM OF PRIORITY

This patent application claims the benefit of priority, under 35 U.S.C. Section 119(e), to Trancik et al. U.S. Provisional Patent Application Ser. No. 60/962,989, entitled "TRANSPARENT AND CATALYTIC CARBON NANOTUBE FILMS," filed on Aug. 2, 2007.

STATEMENT REGARDING FEDERALLY SPONSORED RESEARCH OR DEVELOPMENT

This invention was made with government support under award number CMS-0428716 from the National Science Foundation. The government has certain rights in this invention.

BACKGROUND

Carbon nanotubes (CNTs) include carbon-based fullerene structures that include single-walled nanotubes (SWNTs) and multi-walled nanotubes (MWNTs).

Dye-sensitized solar cells (DSSCs) are solar cells that are potentially more cost-effective than conventional semiconductor solar cells. In an illustrative example, a DSSC can receive sunlight through a transparent conductive anode, such as made of fluorine-doped tin oxide deposited on the back of a glass plate. In this example, on the back of the conductive anode plate is a thin layer of titanium dioxide, which forms a porous structure. A dye is covalently bonded to the titanium dioxide particles, in this example. An iodide/triiodide electrolyte is interposed between the anode and a catalytic conductive (e.g., platinum) cathode, in this example. In operation of this example, sunlight received through the conductive anode excites the dye to inject an electron into the conduction band of the titanium dioxide. In this example, the electron injected by the dye is replaced by an electron from the electrolyte, which oxidizes iodide into triiodide. The triiodide diffuses to the cathode to receive an electron via current flow through the external load circuit of the DSSC, in this example. The DSSC cathode, therefore, injects charge into the electrolyte and catalyzes the reduction of triiodide, in this example. As mentioned above, a DSSC is potentially somewhat more cost-effective at converting sunlight into electricity than a conventional semiconductor solar cell.

Overview

The present inventors have recognized, among other things, that efficiency of the DSSC can be improved if the cathode catalytic activity can be increased. The present inventors have also recognized that the cost of solar electricity can be reduced by decreasing material cost. The present inventors have also recognized that various electrochemical applications can benefit from an electrode with increased catalytic activity. This document describes, among other things, making and using ozone-treated carbon electrochemical device to provide increased catalytic activity. In an example, this can include synthesizing thin, transparent, and highly catalytic carbon nanotube films. Such carbon nanotubes can catalyze the reduction of triiodide. Such a reaction can be important in certain applications, such as in a dye-sensitized solar cell (DSSC). The DSSC can exhibit a charge-transfer resistance, with respect to the reduction of triiodide (such as can be measured by electrochemical impedance spectroscopy), that decreases with increasing carbon nanotube film thickness. The catalytic activity can be significantly enhanced by exposing the nanotubes to ozone, such as to introduce defects in the carbon nanotubes. An ozone-treated, defective nanotube film can serve as a catalytic, transparent, and conducting electrode, such as for the DSSC or another electrochemical device. Illustrative examples of other possible applications include use in a battery, fuel cell, or electroanalytical device.

Example 1 describes a method. In this example, the method can include providing a material comprising carbon. The material can be treated with ozone.

An electrochemical electrode comprising the ozone-exposed material can be provided.

In Example 2, the method of Example 1 optionally comprises providing the electrode as a working electrode in an electrochemical device that is configured to use the catalytic activity of the working electrode in an electrochemical reaction.

In Example 3, the method of one or more of Examples 1-2 optionally can be performed such that treating the material with ozone comprises exposing the material to ozone so as to substantially increase catalytic activity of the material.

In Example 4, the method of one or more of Examples 1-3 optionally can be performed such that exposing the material to ozone so as to substantially increase catalytic activity of the material comprises exposing the material to ozone so as to increase catalytic activity of the material by a factor of at least 10% as compared to catalytic activity of the material before the exposure to ozone.

In Example 5, the method of one or more of Examples 1-4 optionally can comprise forming the electrochemical electrode, including forming a substantially transparent first film comprising carbon nanotubes.

In Example 6, the method of one or more of Examples 1-5 optionally can be performed such that forming the substantially transparent first film comprising carbon nanotubes comprises depositing carbon nanotubes on a transparent substrate.

In Example 7, the method of one or more of Examples 1-6 optionally can comprise forming the electrochemical electrode, including forming an electrochemical electrode comprising graphitic carbon.

In Example 8, the method of one or more of Examples 1-7 optionally can be performed such that treating the material with ozone comprises exposing the material to ozone for a time duration that is between about 1 minute and about 90 minutes.

In Example 9, the method of one or more of Examples 1-8 optionally can be performed such that treating the material with ozone comprises exposing the material to ozone so as to substantially increase catalytic activity of the material comprises obtaining an electrode charge transfer resistance that is at least one of: less than about 22 ohms·cm$^2$ at a light transmittance at 550 nm of at least 98%; less than about 5 ohms·cm$^2$ at a light transmittance at 550 nm of at least 88%; less than about 2 ohms·cm$^2$ at a light transmittance at 550 nm of at least 82%; or less than about 1 ohms·cm$^2$ at a light transmittance at 550 nm of at least 76%.

In Example 10, the method of one or more of Examples 1-9 optionally can comprise providing the electrode in an electrochemical device, including providing the electrode in at least one of a dye-sensitized solar cell (DSSC), a battery, a fuel cell, or an electroanalytical instrument.

In Example 11, the method of one or more of Examples 1-10 optionally can be performed such that the material with ozone comprises generating the ozone using ultraviolet (UV) light.

In Example 12, the method of one or more of Examples 1-11 optionally can comprise providing the electrode in an electrochemical device, including providing the electrode in a dye-sensitized solar cell (DSSC) as a cathode.

In Example 13, the method of one or more of Examples 1-12 optionally can comprise providing the electrode in a dye-sensitized solar cell (DSSC) as a cathode comprises providing the electrode in a DSSC in place of at least one of a transparent conducting oxide (TCO) or a platinum catalyst.

In Example 14, the method of one or more of Examples 1-13 optionally can be performed such that providing a material comprising carbon comprises airbrushing a substance including carbon nanotubes onto a substrate.

Example 15 describes an apparatus. In this example, the apparatus can comprise an electrochemical electrode cathode comprising carbon that has been treated with ozone so as to substantially increase catalytic activity of the electrode as compared to catalytic activity of the electrode before the treatment with ozone.

In Example 16, the apparatus of Example 15 can optionally be configured such that the ozone-treated electrode exhibits an increased catalytic activity of a factor of at least 11% as compared to catalytic activity of the electrode without the ozone-treatment.

In Example 17, the apparatus of one or more of Examples 15-16 optionally can be performed such that the cathode comprises a substantially transparent first film comprising carbon nanotubes.

In Example 18, the apparatus of one or more of Examples 15-17 optionally can be configured such that the cathode comprises graphitic carbon.

In Example 19, the apparatus of one or more of Examples 15-18 optionally can be configured such that the cathode comprises an electrode charge transfer resistance that is at least one of: less than about 22 ohms·cm$^2$ at a light transmittance at 550 nm of at least 98%; less than about 5 ohms·cm$^2$ at a light transmittance at 550 nm of at least 88%; less than about 2 ohms·cm$^2$ at a light transmittance at 550 nm of at least 82%; or less than about 1 ohms·cm$^2$ at a light transmittance at 550 nm of at least 76%.

In Example 20, the apparatus of one or more of Examples 15-19 optionally comprises an anode and an electrolyte. In this example, the cathode, and the electrolyte can be configured to use the catalytic activity of the cathode in an electrochemical reaction.

In Example 21, the apparatus of one or more of Examples 15-20 optionally comprises at least one of a dye-sensitized solar cell (DSSC), a battery, a fuel cell, or an electroanalytical instrument, comprising the cathode, the anode, and the electrolyte.

In Example 22, the apparatus of one or more of Examples 15-21 optionally comprises a DSSC comprising the cathode, the anode, and the electrolyte.

In Example 23, the apparatus of one or more of Examples 15-22 optionally comprises the cathode in a DSSC in place of at least one of a transparent conducting oxide (TCO) or a platinum catalyst.

In Example 24, the apparatus of one or more of Examples 15-23 optionally comprises the cathode in a DSSC in place of both of a transparent conducting oxide (TCO) and a platinum catalyst.

In Example 25, the apparatus of one or more of Examples 15-23 optionally can be configured such that the electrochemical electrode cathode comprises carbon nanotubes airbrushed onto a substrate.

Example 26 describes an apparatus comprising an electrochemical working electrode, an anode, and an electrolyte. In this example, the electrochemical working electrode cathode comprises a transparent film of airbrushed single-walled carbon nanotubes that has been exposed to ozone so as to increase catalytic activity of the electrode by at least a factor of 1.5 as compared to catalytic activity of the electrode before the exposure to ozone, wherein the cathode comprises an electrode charge transfer resistance that is less than about 22 ohms·cm$^2$ at a light transmittance at 550 nm of at least 98%; less than about 5 ohms·cm$^2$ at a light transmittance at 550 nm of at least 88%; less than about 2 ohms·cm$^2$ at a light transmittance at 550 nm of at least 82%; and less than about 1 ohms·cm$^2$ at a light transmittance at 550 nm of at least 76%. In this example, the anode comprises $TiO_2$ nanoparticles comprising chemically adsorbed dye molecules. In this example, the electrolyte comprises a solution of iodide and triiodide. In this example, the anode, the cathode, and the electrolyte are configured to use the catalytic activity of the cathode in an electrochemical reaction that catalyzes the reduction of triiodide without requiring a platinum catalyst.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

The patent or application file contains at least one drawing executed in color. Copies of this patent or patent application publication with color drawing(s) will be provided by the Office upon request and payment of the necessary fee. In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1A:
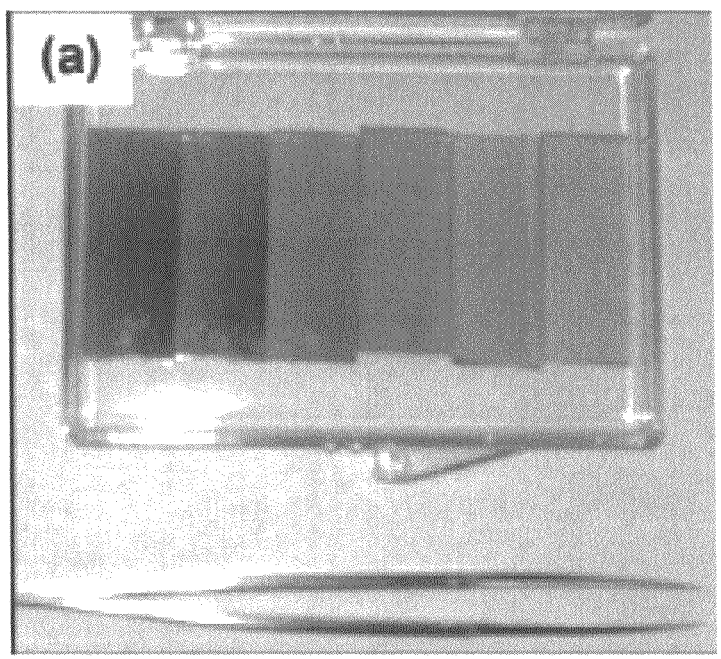
FIG. 1A shows an example of a photo of airbrushed carbon nanotube films of varying thicknesses on a conducting glass substrate, such as made from carbon nanotubes produced by arc discharge.

This document describes, among other things, making and using ozone-treated carbon materials or electrochemical devices to provide increased catalytic activity. In an example, this can include synthesizing thin, transparent, and highly catalytic carbon nanotube films. Such carbon nanotubes can catalyze the reduction of triiodide. Such a reaction can be important in certain applications, such as in a dye-sensitized solar cell (DSSC). The DSSC can exhibit a charge-transfer resistance, such as can be measured by electrochemical impedance spectroscopy, that decreases with increasing film thickness. The catalytic activity can be significantly enhanced (e.g., at a given thickness) by exposing the nanotubes to ozone, such as to introduce defects in the carbon nanotubes. An ozone-treated, defective nanotube film can serve as a catalytic, transparent, and conducting electrode, such as for the DSSC or another electrochemical device. Illustrative examples of other possible applications include use in a battery, fuel cell, or electroanalytical device.

Carbon nanotubes can provide a number of advantages, such as one or more of good electrical conductivity, high chemical stability, high surface area, and good optoelectronic properties. This makes carbon nanotubes excellent candidates for a variety of applications, such as energy conversion or storage technologies. Moreover, carbon nanotubes can be shown to be electrochemically active in several systems. For example, carbon nanotubes can be catalytic in a DSSC, or in one or more electroanalytical applications. Carbon nanotubes can provide sites for catalysis or intercalation, such as in hydrogen fuel cells or in lithium ion batteries.

In an example, the catalytic activity of single-walled carbon nanotube films in an electrochemical device, such as a DSSC, can be quantified. A DSSC can include dye molecules that are chemically adsorbed on an anode, such as on the surface of a $TiO_2$ nanoparticle network anode. The anode can contact electrolyte, such as redox active electrolyte. In an example, the electrolyte can include a solution comprising iodide and triiodide molecules. The DSSC anode can serve as a current collector for photogenerated electrons in the nano- particle network. The DSSC can also include a cathode that injects charge into the electrolyte and catalyzes the reduction of triiodide, such as described by:

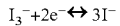

A DSSC cathode can be made from a thin (e.g., 1-5 nm thick) layer of a platinum catalyst deposited on a substantially transparent conducting oxide (TCO), such as fluorine tin oxide (FTO) on glass or indium tin oxide (ITO) on a glass or polymer substrate. A transparent cathode allows for straightforward use of low-cost, flexible substrates, because the $TiO_2$ anode films can be sintered at high temperature on an opaque metallic film. Sunlight can be received into the DSSC via the transparent cathode, in an example. A transparent cathode can also allow for construction of a tandem or other plural cell, which can include two or more separate stacked or otherwise arranged compartments with dye molecules that absorb different parts of the solar spectrum. These measures can achieve high efficiency cells, and lower the cost of solar-generated electricity.

It can be shown that carbon nanotubes can also catalyze the reduction of triiodide. Therefore, carbon nanotubes could replace the platinum catalyst in the DSSC. In this context, carbon nanotube films could provide several advantages. For example, platinum can degrade over time while in contact with an iodide/triiodide liquid electrolyte. This can reduce the efficiency of a DSSC. By contrast, it is believed that carbon nanotubes will not degrade in this way. A film of carbon nanotubes can provide high conductivity and transparency. It can be shown that such a carbon nanotube film can reach performance approaching that of a TCO on a rigid substrate, and comparable to a TCO on a flexible substrate. Such properties can individually or collectively help permit carbon nanotubes to be able to replace the TCO layer that would otherwise be used in the DSSC, as well as to replace the platinum catalyst that would otherwise be used in the DSSC. The transparency and good electrical conductivity of carbon nanotube films can be advantageous over other alternative catalysts, such as carbon black films, which can be catalytic in a DSSC, but are opaque and less electrically conductive. Carbon nanotube films can be much more physically flexible and less prone to cracking than TCOs. This can make carbon nanotube films good candidates for inexpensive roll-to-roll processing or varied installation configurations.

Catalytic activity of carbon nanotube films can be quantified. Carbon nanotube film processing can be used to increase the electrochemical activity of a carbon nanotube film. In an example, electrochemical impedance spectroscopy (EIS) can be used to measure charge-transfer resistance $R_{CT}$, such as associated with the reduction of triiodide as a function of carbon nanotube film transparency and "loading." The "loading" can be thought of as the CNT mass per unit area. Obtaining desired results with less loading can be desirable, because using less CNTs can save money. Exposing the carbon nanotube films to ozone (such as UV-generated ozone) can dramatically increase their catalytic activity. Without being bound by theory, it is believed that ozone exposure of carbon nanotubes increases their catalytic activity by introducing defects into the carbon nanotubes. In an example, such as described below, ozone-treated carbon nanotubes can provide high enough performance to replace a platinum catalyst that would otherwise be used in a DSSC. In an example, carbon nanotube films can be optimized to concurrently provide good transparency, conductivity, and catalytic activity. In an example, a carbon nanotube film can be used to replace both a platinum catalyst and a TCO that would otherwise be used in a DSSC.

SOME ILLUSTRATIVE EXPERIMENTAL EXAMPLES

In an example, a carbon nanotube film was deposited, such as from single-walled carbon nanotubes that were produced using arc discharge, such as shown in FIGS. 1A-1D.

FIGS. 1A-1D show examples of images of carbon nanotube films showing examples of the effect of examples of synthesis procedure on carbon nanotube film morphology.

FIG. 1A shows an example of a photo of airbrushed carbon nanotube films (such as made from carbon nanotubes produced by arc discharge) of varying thicknesses on a conducting glass substrate. In this example, carbon nanotubes were suspended in an ethanol solution and airbrushed onto a conducting glass substrate.

Figure 1B:
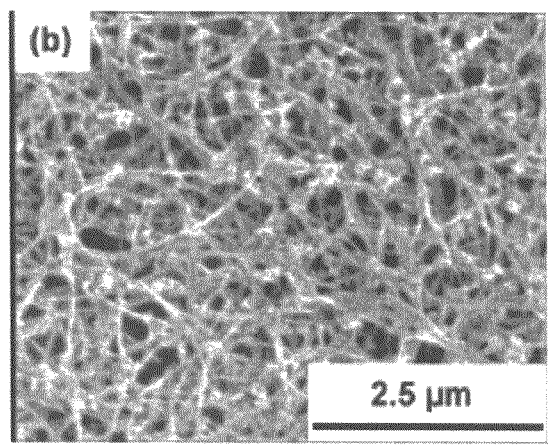
FIG. 1B shows an example of a scanning electron microscope (SEM) image of films of arc discharge produced carbon nanotubes, such as that have been deposited using an airbrush technique.

FIG. 1B shows an example of a scanning electron microscope (SEM) image of airbrushed films of arc discharge produced carbon nanotubes. In the example of FIG. 1B, these carbon nanotube films can include short single-walled carbon nanotube bundles. In this example, the short nanotube length is a result of long sonication times.

Figure 1C:
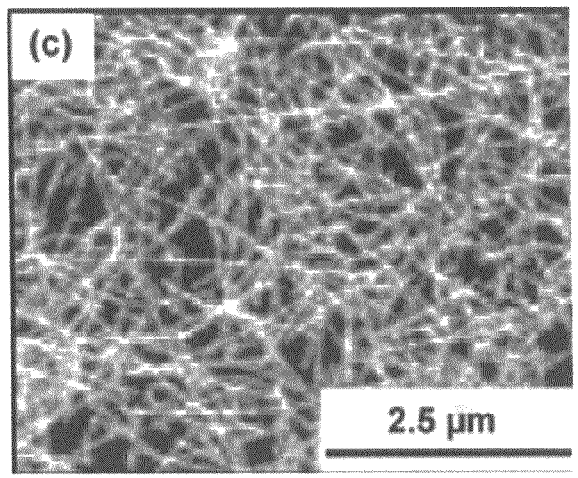
FIG. 1C shows an example of a SEM image of a CVD grown carbon nanotube mat film, in which carbon nanotubes are grown in the plane of the substrate.

FIG. 1C shows an example of a SEM image of a CVD grown carbon nanotube mat film, in which carbon nanotubes are grown in the plane of the substrate. In this example, the CVD mat films can include long, single carbon nanotubes. In an illustrative experimental example of using chemical vapor deposition (CVD) of carbon nanotube films to form mats, films were grown on quartz substrates using chemical vapor deposition (CVD), with Fe nanoparticles and cobalt as catalysts and CO or ethanol as a feedstock. Typical processing conditions can involve flowing $H_2$ at 1000 sccm and CO at 1000 sccm, such as through a quartz tube heated to 900° C. Argon was used to clean the system before growth.

Figure 1D:
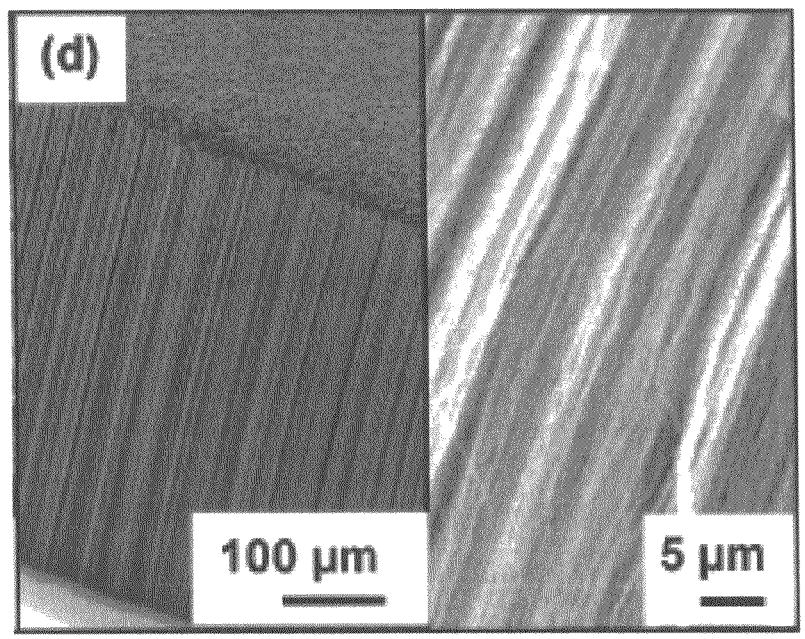
FIG. 1D shows an example of a SEM image of a CVD forest film, in which carbon nanotubes are grown perpendicular to the substrate.

FIG. 1D shows an example of a SEM image of a CVD forest film, in which carbon nanotubes are grown perpendicular to the substrate. In this example, CVD forest films include multiwalled nanotubes (e.g., with a few walls). The CNTs can be transferred to a desired substrate, such as by direct contact (e.g., by rubbing a wooden tip along the growth substrate and then the desired substrate) or can be put in a solution and airbrushed on a substrate. In an illustrative experimental example of using CVD of carbon nanotube films to form forests, carbon nanotube films were grown on silicon wafer substrates that were coated with a 10 nm layer of $Al_2O_3$ and a 0.5 nm layer of iron as catalyst, using ethylene as a feedstock. The carbon nanotubes were grown in a quartz tube heated to 750° C. by flowing argon through a bubbler at approx 3-4 sccm, ethylene at 200 sccm, and hydrogen at 400 sccm for 10 minutes, in this example.

In some examples, airbrushing of arc discharge tubes (such as shown in the examples of FIGS. 1A and 1B) yielded the most reproducible results and easiest deposition at a range of thicknesses and on a variety of substrates, and was therefore used for most of the electrochemical characterization unless otherwise specified. In an illustrative experimental example of airbrushing, clean glass or FTO covered glass substrates were placed on an aluminum foil covered hot plate heated to 100° C. The airbrush (e.g., McMaster Siphon-Feed Air-Brush Kit) was connected to an argon gas source and the suspension was sprayed onto the heated substrate. With a light mist, the solution evaporates on contact, producing a uniform film on the substrate.

In the example of FIGS. 1A-1C, the carbon nanotubes included metal impurities. In this example, the metal impurities included nickel and yttrium, such as in a ratio of approximately 3:1 atom %, totaling approximately 7% by weight, such as can be determined by thermal gravimetric analysis. In this example, in addition to single-walled nanotubes, the samples can include carbonaceous impurities, such as in the form of amorphous carbon and graphitic nanoparticles of less than 10 wt % (e.g., as can be defined in terms of relative purity and characterized using near-infrared spectroscopy). In this example, the carbon nanotube films were suspended in a variety of solvents, sonicated for 16 hours, and airbrushed onto a substrate placed on a hot plate at 100-150° C.

In an illustrative experimental example, to create a suspension of carbon nanotubes, 1 to 3 mg of carbon nanotubes (e.g., about 7 wt % metal impurities such as nickel and yttrium in a ratio of 3:1 atom % and up to 10%, in terms of relative purity, of amorphous carbon and graphitic nanoparticles, Carbon Solutions Inc., produced using arc discharge) were added to 25 ml of a solvent. Various solvents were used including a 1% solution of sodium dodecyl sulfate (SDS), dichloroethane (DCE) and ethanol. Ethanol suspensions produced the most uniform airbrushed films. After adding the tubes to solution, the suspension was sonicated for 16 hours, and then centrifuged at medium speed for 30 minutes. The remaining top ¾ of the solution was then used for airbrushing. Suspensions were also made with CVD forest tubes.

In an example, an ethanol solvent combined with airbrushing yielded the most reproducible results and easiest deposition on a variety of substrates and was therefore used for most electrochemical characterization. Although the carbon nanotube films were electrically conductive on their own, a conducting substrate (e.g., glass coated with $F:SnO_2$ (FTO), such as having a sheet resistance of 15 Ω/square) was used to obtain reliable electrochemical data from carbon nanotube films having a wide range of thicknesses. The conducting substrate helped ensure that all films had a constant, low ohmic resistance. The FTO substrate films do not on their own catalyze the reduction of triiodide, and therefore should not interfere with the electrochemical data.

In some examples, chemical vapor deposition (CVD) can be used, such as to grow both mats and forests of carbon nanotubes, such as shown in the examples of FIGS. 1C-1D. In an example, such mats can include long, single-walled carbon nanotubes, which can be oriented along the plane of the substrate. The mats were used to demonstrate our ability to vary tube length and thereby adjust or optimize conductivity of the carbon nanotube film. The carbon nanotube forest samples yield few-walled tubes, which can be oriented perpendicular to the substrate. The forest samples were used to make ultrapure carbon nanotube films, due to the extremely low metal (e.g., iron) to carbon ratio (e.g., metal content <0.01 wt %). By transferring a film of the forest of carbon nanotubes to a conducting glass substrate (e.g., using either direct contact or airbrushing tubes in an ethanol solution) and characterizing these samples using EIS, it was possible to investigate the impact of metal impurities on the catalytic activity of the carbon nanotube films. (Note that the films made from airbrushed, arc-discharge carbon nanotubes were the most evenly distributed, and therefore the bulk of the electrochemical data that was recorded is from these samples, unless otherwise specified.) For comparison purposes, thin layers of platinum (e.g., 1-5 nm) were deposited on FTO using e-beam evaporation. The light transmittance of all films was measured using UV-visible spectroscopy (e.g., Cary 50 Bio UV-visible spectrophotometer).

Using EIS, the catalytic activity of carbon nanotube films for reduction of triiodide was characterized. In an example, a three-electrode cell, providing strict control of electrode potential, was used to measure the charge-transfer resistance $R_{CT}$ at the carbon nanotube/electrolyte interface. $R_{CT}$ indicates the electron transfer resistance, and thus varies inversely with the triiodide reduction activity of the carbon nanotubes.

In an example, an electrochemical cell can include a working electrode (e.g., carbon nanotube film+FTO+glass), a reference electrode (e.g., Ag/AgCl), and a counter-electrode (e.g., platinum wire). In example, the electrolyte comprised 0.05 M $I_2$+0.5 M LiI in an aqueous solution. Non-aqueous solutions can be employed in the DSSC, due to lower efficiencies exhibited by aqueous cells. It may be possible, however, to increase or optimize the efficiency of aqueous cells because of their potential as low-cost, environmentally friendly substitutes for a volatile and flammable non-aqueous electrolyte. In an example, a non-aqueous acetonitrile ($CH_3CN$) based electrolyte solution was also used, but offered less reproducibility and stability. Therefore, in this example, trends in the catalytic activity of the carbon nanotube films are presented from testing in an aqueous solution. Measurements were made with a Schlumberger SI 1255 HF frequency response analyzer and an EG+G Princeton Applied Research potentiostat/galvanostat model 273A, in an example. Cell measurements were taken at a working electrode potential of 300 mV, away from the mass-transport limited region, and over a frequency range of 0.1-100000 Hz, in an example.

Figure 2:
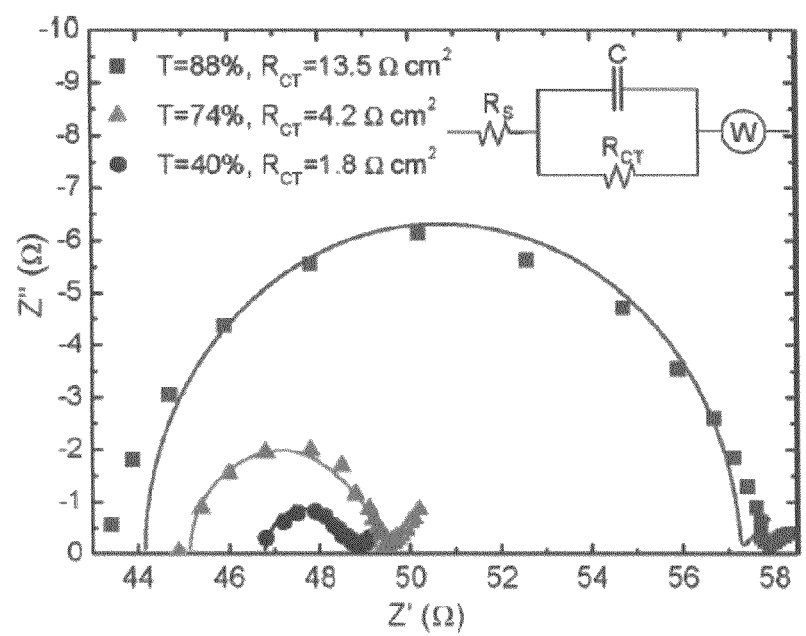
FIG. 2 shows an example of Nyquist plots illustrating how charge-transfer resistance ($R_{CT}$) can decrease with increasing film thickness.

FIG. 2 shows an example of Nyquist plots illustrating how charge-transfer resistance ($R_{CT}$) can decrease with increasing film thickness. This indicates that thicker carbon nanotube films are more catalytic than thinner carbon nanotube films. The Nyquist plots shown in FIG. 2 illustrate an example of data for airsprayed carbon nanotube films with varied loading. In this example, measurements were made at 300 mV so as to avoid the mass transport limited regime. The frequency range was 0.1-100000 Hz, with frequency decreasing from left to right along the x-axis, however, high frequency points below the x-axis are not shown in FIG. 2. The decreasing radius of the semicircle shown indicates a decrease in $R_{CT}$. The inset shows an example of an equivalent circuit used to model this system. In an example, the equivalent circuit can include a component $R_s$=series resistance, $R_{CT}$=the charge-transfer resistance, C=double layer capacitance, and W=Warburg impedance. Light transmittance values indicated in FIG. 2 are for the carbon nanotube film alone; the contribution from the FTO layer has been subtracted.

It was observed that $R_{CT}$ at the interface between the electrolyte and the carbon nanotube film decreases with increasing carbon nanotube loading and decreasing light transmittance. FIG. 2 shows examples of Nyquist plots for carbon nanotube films with light transmittance ranging from 40 to 90% and $R_{CT}$ ranging from 1.8 to 13.5 $\Omega cm^2$. This difference in $R_{CT}$ is due to the increase in surface area of the carbon nanotube films that accompanies higher nanotube loading. The plots were fitted with an equivalent circuit, such as shown in FIG. 2. In an example, the equivalent circuit included the $R_{CT}$ in parallel with a double-layer capacitance C, both of which are in series with the Warburg impedance W and series resistance $R_s$. In this example, C increases systematically with nanotube loading, such as expected due to an increase in active surface area. In this example, $R_s$ includes the ohmic resistance of the electrolyte, the conducting substrate, and the nanotube film layers, and does not vary significantly with carbon nanotube loading. The Warburg impedance can be attributed to mass transport limitations, such as due to diffusion in the electrolyte, and does not vary significantly with carbon nanotube loading.

As-deposited, carbon nanotubes display significant catalytic activity. In an example, the thickest film (e.g., T=40% and nanotube loading ~0.15 mg/$cm^2$) exhibits a charge-transfer resistance of 1.8 $\Omega cm^2$, a value that is comparable to that achieved by opaque carbon black films of ~10-120 µm thickness (e.g., loading ~1-2 mg/$cm^2$). Note that this comparison takes into account differences in absolute values of $R_{CT}$ due to the non-aqueous electrolyte used in the carbon black study. In an example, the $R_{CT}$ of the thicker carbon nanotube films can approach that of a thin layer of platinum (e.g., ~0.5$\Omega$ for a 1 nm e-beam evaporated film), albeit with lower transparency than the thin layer of platinum.

Certain current-voltage simulation results suggest that surface defect sites, in particular edge-plane-like defect sites, are responsible for much of the catalytic activity, electron transfer, and chemical reactivity of graphitic carbon or carbon nanotubes. Ozone treatment of carbon nanotubes can be shown, using Raman spectroscopy and X-ray photoelectron spectroscopy, to lead to increased defect density, such as due to sidewall oxidation. The increased defect density can result in irreversible increases in the electrical resistance of tubes. For example, Raman spectra can show that the ratio of the D-band to the G-band increases linearly with ozone exposure time. A carbon nanotube films can be exposed to UV-generated ozone (e.g., UVOCS UV ozone cleaner), such as to introduce defects in the carbon nanotube film. The resulting change in catalytic activity can be studied.

Figure 3A:
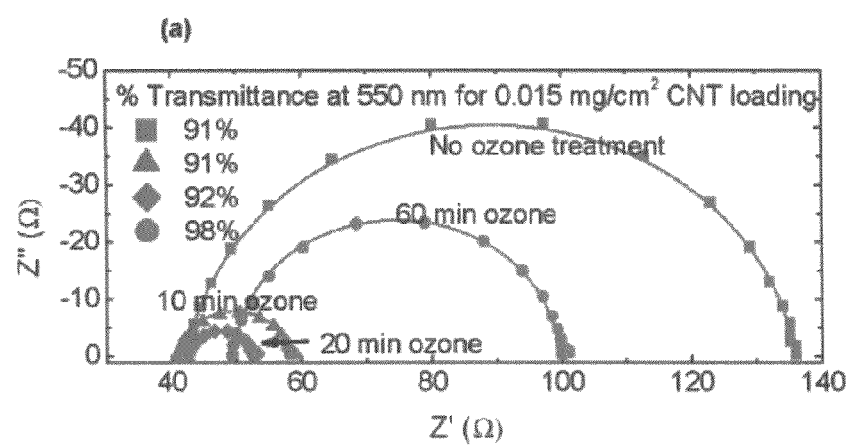
FIG. 3A shows an example of Nyquist plots for an example of ozone-treated carbon nanotube film with about 0.015 mg/cm$^2$ loading.

FIG. 3A shows an example of Nyquist plots for an example of ozone-treated carbon nanotube film with about 0.015 mg/$cm^2$ loading. In this example, the decreasing radius of the semicircle indicates a decrease in $R_{CT}$, which, in turn, indicates increased catalytic activity. An example of the equivalent circuit is shown in FIG. 2.

Figure 3B:
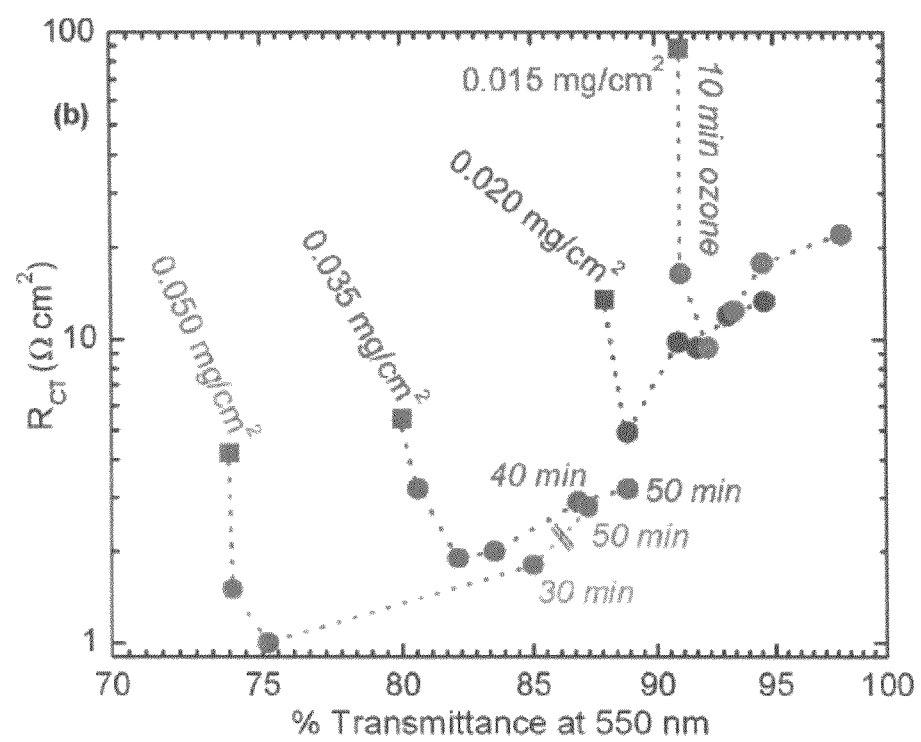
FIG. 3B shows an example of $R_{CT}$ vs. T, such as for films with varying carbon nanotube loading and ozone treatment durations.

FIG. 3B shows an example of $R_{CT}$ vs. T, such as for films with varying carbon nanotube loading and ozone treatment durations. In the example of FIG. 3B, $R_{CT}$ decreases initially and then begins to increase with longer ozone treatment durations. T increases with ozone treatment duration. In the example of FIG. 3B, the transmittance values are for the carbon nanotube film alone. Different colors indicate samples with different carbon nanotube loading. Squares signify untreated samples. Circles indicate samples that were treated with UV-generated ozone. The minutes of ozone treatment duration are shown for samples that are within an approximate target region of suitability for a DSSC. The data point for the ~0.050 mg/$cm^2$ sample exposed to ozone for 40 minutes was left out of FIG. 3B, due to poor measurement quality. The data point for the untreated ~0.035 mg/$cm^2$ sample has a large error in $R_{CT}$ (~10%), which is believed attributable to poor measurement quality. The far lower right region of low charge-transfer resistance and high transmittance is desirable, such as for a DSSC application.

FIGS. 3A, 3B indicate that carbon nanotube films become more catalytic after ozone treatment. The results shown in FIGS. 3A, 3B are for airbrushed films of carbon nanotubes produced using arc discharge, such as described above with respect to FIGS. 1A, 1B. In an example, for a given carbon nanotube film thickness, $R_{CT}$ decreased with ozone exposure (e.g., applied in 10 minute intervals) for exposure times up to 20 minutes and then increased after being treated with ozone for a further ozone exposure time, such as shown in the example of FIG. 3A. In an example, the magnitude of the decrease in $R_{CT}$ is greater for thin carbon nanotube film samples than for thick samples. For example, for a 0.015 mg/$cm^2$ sample, $R_{CT}$ decreased from 88.4 to 9.4 $\Omega cm^2$ after 20 minutes of ozone exposure treatment. In an example, the light transmittance of all carbon nanotube films increased only slightly after 10 min of ozone exposure and more dramatically for longer exposures. In an example, the sheet resistance of carbon nanotube films on insulating substrates changed only slightly with short ozone exposure times and then increased significantly for longer exposures. From these results, it can be inferred that short ozone exposure (e.g., ≤20 minutes) introduces defects into the carbon nanotubes that increase their catalytic activity without significantly changing either the light transmission or sheet resistance of the carbon nanotube film. Without being bound by theory, it is believed that longer ozone exposure can begin to remove carbon nanotubes, thereby increasing the light transmittance, sheet resistance, and $R_{CT}$.

In an example, the effect of ozone treatment in an acetonitrile ($CH_3CN$) based, non-aqueous solution can be measured, such as to determine whether the treatment was simply making the tubes more hydrophilic. An initial decrease and then increase in the charge-transfer resistance with increasing ozone treatment duration was also observed in these samples.

Figure 4:
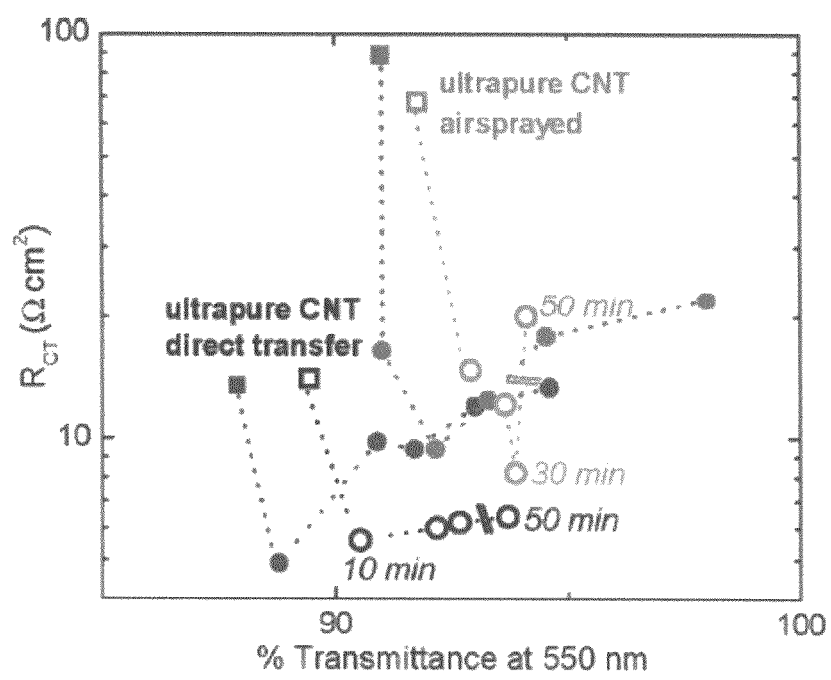
FIG. 4 shows an example $R_{CT}$ vs. T for examples of carbon nanotube films made from few-walled, carbon nanotube forests that are grown via chemical vapor deposition (e.g., such as shown in FIG. 1D) and are ultrapure (e.g., metal content <0.01 wt %).

Without being bound by theory, the observed results are also inconsistent with other proposed mechanisms for catalysis, such as electrochemical activity, which is dominated by the metal impurities remaining in the nanotube samples. Metal impurities, which are sheathed by several graphene sheets, can remain in carbon nanotube samples after purification procedures. These impurities can be shown to be a significant factor in the electrochemical activity of carbon nanotubes in certain systems, such as for the reduction of hydrogen peroxide, in an example. To test the possible effect of metal impurities (e.g., in the case of films such as those represented in FIGS. 3A, 3B, the impurities comprise nickel particles) on the electrochemical activity, ultrapure carbon nanotube films from forests grown by CVD, such as shown in FIG. 1D, were studied. The ultrapure carbon nanotube films exhibit similar behavior to the carbon nanotube films made from arc discharge produced carbon nanotubes. As shown in the example of FIG. 4, it can be observed that there is a significant decrease in $R_{CT}$ after ozone exposure. Therefore, these results strongly support a model of catalysis at defect sites, a phenomenon that can be useful in a wide variety of systems beyond a DSSC.

FIG. 4 shows an example $R_{CT}$ vs. T for examples of carbon nanotube films made from few-walled, carbon nanotube forests that are grown via chemical vapor deposition (e.g., such as shown in FIG. 1D) and are ultrapure (e.g., metal content <0.01 wt %). As shown in FIG. 4, such carbon nanotubes become more catalytic with ozone treatment. FIG. 4 also shows results for an airbrushed carbon nanotube film, in which carbon nanotubes are suspended in ethanol (shown by grey symbols), and results for a carbon nanotube film that has been directly transferred from the growth substrate onto the conducting glass substrate (black symbols). FIG. 4 shows $R_{CT}$ and T for carbon nanotube films with varied ozone treatment durations. In the example of FIG. 4, $R_{CT}$ decreases initially and then increases with longer ozone treatment durations. T increases with treatment duration. In FIG. 4, the transmittance values are for the carbon nanotube film alone. In an example, due to the uneven nature of the airbrushed film made from forest carbon nanotubes, the transmittance values of the airbrushed carbon nanotubes are more uncertain than for other films. The results shown in FIG. 4 can be overlaid on those presented in FIG. 3B for airbrushed films from arc discharge produced carbon nanotubes, such as to show that both types of carbon nanotube films exhibit similar behavior. This similarity between the airbrushed forest carbon nanotubes and the airbrushed arc discharge produced carbon nanotubes confirms that the catalytic properties observed are not dominated by metal impurities.

An attractive feature of the ozone treatment technique is that it allows one to study a carefully controlled film morphology that is similar before and after the ozone treatment, apart from the structural changes induced by the ozone treatment. The ozone treatment technique can be used to study electrochemical activity of single carbon nanotubes or dense carbon nanotube films. Moreover, the ozone treatment technique can be less intrusive than other techniques for inducing disorder in carbon nanotubes, such as ball milling, or prolonged sonication in acid solutions. Such other techniques can require redeposition of the carbon nanotube film, thus greatly modifying the original carbon nanotube film morphology.

In addition to its effectiveness for basic characterization of electrochemical effects of defects, ozone treatment also has practical benefits as a processing technique. With ozone treatment, it is easy to control the exact degree of ozone treatment by varying the duration of the ozone treatment. Also, ozone treatment is likely to be more economically viable than the other techniques mentioned. Ozone treatment does not require additional solution processing and does not waste carbon nanotubes. Ozone processing can be useful to increase the efficiency of a carbon nanotube electrode, such as for an electrochemical photovoltaic cell, an electrochemical battery, a fuel cell, or an electroanalytic device, such as for application in which defects in the carbon nanotubes are expected to be important, such as for lithium intercalation, for catalyzing the reduction of oxygen, or for sensing one or more chemical species.

The effect of ozone treatment for a graphite sample in aqueous solution was tested, and it was found that $R_{CT}$ decreased. From this, it can be inferred that ozone treatment can be a useful and inexpensive procedure for increasing the electrochemical activity of graphitic carbon materials in a variety of configurations, not just carbon nanotubes. Ozone-treated single-walled carbon nanotubes, however, can offer an attractive combination of one or multiple properties, such as one or more of light transmittance, electrical conductance, or catalytic activity.

In an example, a carbon nanotube film can be employed in a DSSC as a transparent, conducting, and catalytic layer, replacing either or both of the TCO and platinum that would otherwise be used in the DSSC. In some examples, carbon nanotube films can demonstrate performance comparable to that of TCOs on flexible substrates, and approaching that of TCOs on rigid substrates. Further increases in one or both of electrical conductivity or light transmittance can be possible for carbon nanotube films with longer nanotubes. Without being bound by theory, the ratio of light transmittance to sheet resistance is expected to increase with nanotube length, such as up to a limit where the resistance of the nanotubes themselves dominates that of the junctions between nanotubes, which can be estimated to occur at a length between about 20 μm and 30 μm. Without being bound by theory, up to this value, theory predicts and experiments (e.g., on single-walled nanotube bundles ranging in length from about 0.4 μm to about 4 μm) have shown, that the conductivity of a carbon nanotube film can increase as a function of the length of nanotubes, such as following a power law with an exponent of about 1.5. Based on this relationship, well-dispersed carbon nanotube films with an average nanotube length of 25 μm can be predicted to exhibit a sheet resistance ($R_s$) of ~20 Ω/square at a light transmittance of ~90%. At these levels, the carbon nanotube film can perform comparably to that of a TCO on glass and better than TCOs on flexible substrates, such as shown in Table 1.

TABLE 1

Light Transmittance, Charge-Transfer Resistance,
and Sheet Resistances for Various Films

| Sample | % light transmittance at 550 nm | charge-transfer resistance RCT ($\Omega$ cm$^2$) | sheet resistance $R_{sq}$ ($\Omega$/square) |
|---|---|---|---|
| FTO + glass | 82.4 | very high | 15 |
| FTO + 1 nm Pt + glass | 80.4 | ≤0.5 | 15 |
| FTO + 5 nm Pt + glass | 67.1 | <0.5 | 15 |
| ITO + 1 nm Pt + polymer | 78 | <0.5 | 60-250 |
| Target CNT film on polymer or glass | 80 | 2-3 | 20 |

In Table 1, the "Target CNT film on polymer or glass" represents a target carbon nanotube (CNT) film for replacing FTO or ITO+Pt in a DSSC. This target CNT film should be well within an achievable range, based on theory, but the sheet resistance has not yet been demonstrated experimentally by the Applicant. The Target CNT film information in Table 1 assumes the following: bottom layer tube length of 25 μm, leading to a reduced sheet resistance, top layer is a CNT film with a loading of ~0.035-0.050 mg/cm and treated with ozone for a time between about 30 minutes and about 50 minutes. In an example, it may be worth using a carbon nanotube film with somewhat higher initial $R_{CT}$ value than platinum in order to avoid "seasoning," which can decrease the efficiency of a DSSC up to 2-4%, depending on the platinum deposition method used.

The performance of TCOs on flexible substrates can be limited by challenges in depositing uniform TCO films at low temperatures. Carbon nanotube films can, however, easily be deposited on a variety of substrates, such as either using direct deposition (airbrushing) or by using a transfer procedure following vacuum filtration or CVD growth. Lower sheet resistance levels should be achievable with high fractions of metallic-to-semiconducting nanotubes. Without being bound by theory, the nature of the nanotube junctions can also expected to be a factor in determining electrical conductivity.

An experimental challenge is to develop carbon nanotube films that include long nanotubes and where the CNT loading is high enough to achieve low sheet resistance. In an example, this should be achievable by growing thick CVD mat films (e.g., thicker than that shown in FIG. 1C), or developing filtered and airbrushed CNT films that can be evenly distributed across a substrate surface without requiring long sonication times. Preliminary results in this area indicate that a target catalytic, transparent, and conductive nanotube sample, should perform comparably close to a TCO and platinum on glass, and may outperform these films on flexible substrates, such as shown in the example of Table 1. This example assumes an underlying, highly conductive layer of tubes a layer of ozone-treated tubes.

To recap, carbon nanotube films can be effective at catalyzing the reduction of triiodide. The catalytic strength of CNT thin films can be greatly enhanced by exposing the nanotubes to UV-generated or other ozone, such as to introduce defects. Synthesis can yield carbon nanotube electrodes that are transparent, conductive, and catalytic, such for application in a dye-sensitized solar cell, or other electrochemical application. Some examples of other applications for ozone-treated catalytic carbon nanotube films include lithium ion batteries, hydrogen fuel cells, or electroanalytical instruments.

Figure 5:
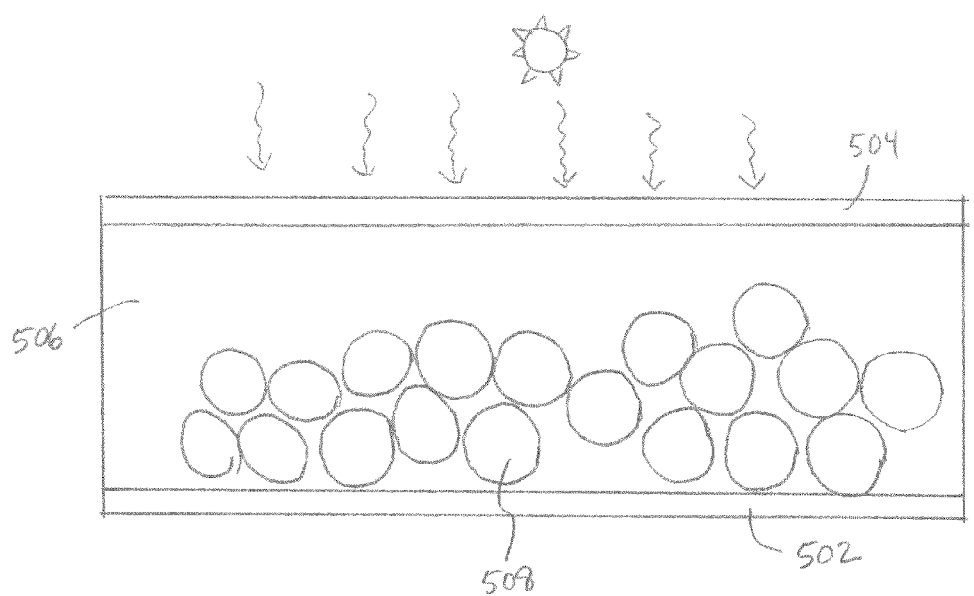
FIG. 5 is a cross-sectional schematic drawing of an example of a solar cell that includes a substantially transparent conductive anode that is separated from a catalytic conductive cathode by an electrolyte region and a light-sensitive dye material.

FIG. 5 is a cross-sectional schematic drawing of an example of a solar cell 500 that can include a conductive anode 502 that can be separated from a substantially transparent catalytic conductive cathode 504, such as by an electrolyte region 506 and a light-sensitive dye material 508. In an example, the anode comprises a TiO$_2$ nanoparticle network anode 502, to which photosensitive dye molecules (e.g., a ruthenium complex, etc.) can be chemically adsorbed to provide the dye material 508, such as described above. In an example, the electrolyte region 506 can include an electrolyte solution comprising iodide and triiodide molecules, such as described above. In an example, the catalytic conductive cathode 504 can include a substantially transparent catalytic carbon cathode, such as a film or other region of carbon nanotubes or graphitic carbon, which can be ozone-treated to increase its catalytic activity, such as described above.

In an example, the ozone-treatment increases the catalytic activity of the catalytic carbon cathode electrode 504 by at least 10% from that before the ozone treatment. In other examples, the catalytic activity increase can be by a factor of 1.5, 2, 3, or even 10, such as described above, and the amount can depend at least in part on the thickness of the catalytic carbon cathode electrode 504. The catalytic activity can be represented by a charge transfer resistance, $R_{CT}$, which in certain examples can range between about 1 $\Omega$cm$^2$ and about 100 $\Omega$cm$^2$, depending on the thickness of the ozone-exposed region of the catalytic carbon cathode electrode 504 and the duration of the ozone treatment, such as described above.

In certain examples, the ozone-treated catalytic carbon cathode electrode 504 can be substantially transparent to light. This can be advantageous, for example, to allow stacking of multiple solar cells, such as to increase the efficiency of the solar electrical energy generation, or to allow for the use of flexible substrates. In certain examples, the transmittance of light (e.g., at 550 nm) can range between about 30% and about 98%, or even between about 70% and about 98%, such as described above.

In certain examples, it is useful (e.g., in a DSSC or other electrochemical device) to concurrently provide both transparency to light and high catalytic activity. An increase in catalytic activity corresponds to and can be represented by a decrease in charge transfer resistance, $R_{CT}$. In certain examples, the ozone-treated catalytic carbon electrode 504 can provide a charge transfer resistance of less than or equal to about 22 $\Omega$cm$^2$, such as at a light transmittance that is greater than or equal to about 98% (e.g., at 550 nm wavelength light). In certain examples, the ozone-treated catalytic carbon electrode 504 can provide a charge transfer resistance of less than or equal to about 5 $\Omega$cm$^2$, such as at a light transmittance that is greater than or equal to about 88% (e.g., at 550 nm wavelength light). In certain examples, the ozone-treated catalytic carbon electrode 504 can provide a charge transfer resistance of less than or equal to about 2 $\Omega$cm$^2$, such as at a light transmittance that is greater than or equal to about 82% (e.g., at 550 nm wavelength light). In certain examples, the ozone-treated catalytic carbon electrode 504 can provide a charge transfer resistance of less than or equal to about 1 $\Omega$cm$^2$, such as at a light transmittance that is greater than or equal to about 76% (e.g., at 550 nm wavelength light).

In certain examples, the ozone-treated region of the catalytic carbon cathode electrode 504 can be highly conductive, such as with a sheet resistance $R_{sq}$ that is in a range between about 10 $\Omega$/square and about 300 $\Omega$/square, such as described above.

The ozone-treated carbon region can be used as a working or other electrode in the DSSC 500, or as a working or other electrode in a battery, a fuel cell, or an electroanalytical instrument. In the DSSC 500, the ozone-treated carbon region can be used as a cathode 506 in place a transparent conducting oxide (TCO) that would otherwise be used as the cathode 506 of the DSSC 500. In the DSSC 500, the ozone-treated carbon region can be used in place a platinum catalyst that would otherwise be used in the DSSC 500. In an example, the ozone treated carbon nanotube or graphitic carbon region can be used in place of both of a transparent conducting oxide (TCO) and a platinum catalyst.

Figure 6:
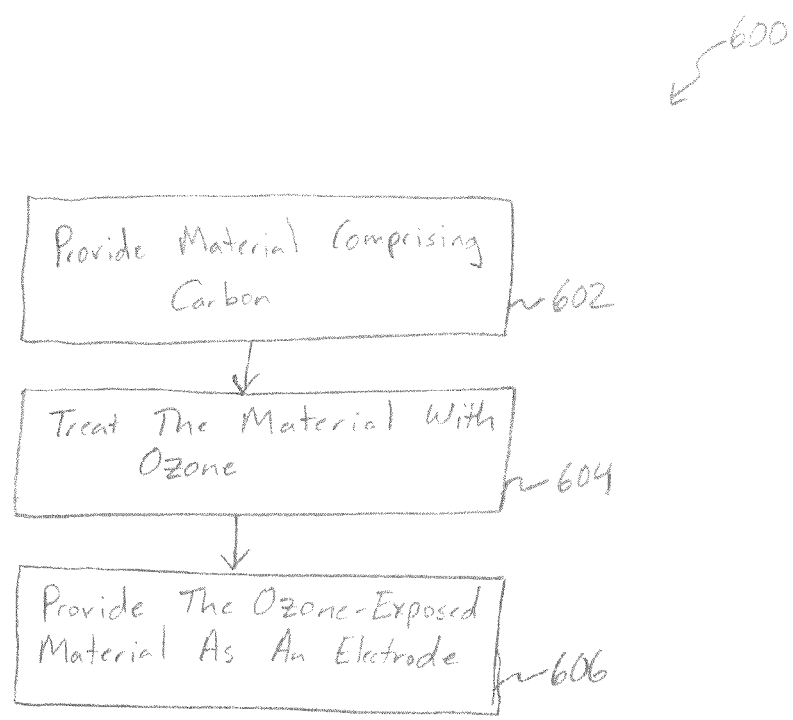
FIG. 6 shows an example of a method, which can enhance catalytic activity of an electrode.

FIG. 6 shows an example of a method 600, which can enhance catalytic activity of an electrode. In this example, at 602, a material comprising carbon can be provided. At 604, the material can be treated with ozone. At 606, the ozone-exposed material can be provided as an electrode, such as in an electrochemical device, such as described above, including with respect to FIG. 5.

In an example, at 602, carbon nanotubes or graphitic carbon is provided as the material comprising carbon. At 602, this can include providing arc discharge produced carbon nanotubes that are mixed into an ethanol or other solution and airbrushed onto a conducting glass or other substrate, as described above, such as to form a CNT film upon the substrate. At 602, this can include providing CVD grown CNTs (e.g., planar mat CNTs or perpendicular forest CNTs), which can be transferred onto a desired substrate by roll-on or another other direct contact technique, or a solution-based technique (e.g., airbrushing), such as described above.

In an example, at 604, the CNT or other carbon material is ozone-treated, such as to increase its catalytic activity, such as by a factor of between about 1.5 and about 10, such as described above, as compared to the catalytic activity before ozone treatment. In an example, the ozone treatment can include exposure to UV-generated or other ozone for a time duration that is between about 1 minute and about 90 minutes or between about 10 minutes and 30 minutes (depending on the thickness and CNT loading; see, e.g., FIG. 3B), such as described above. In an example, treating the material with ozone comprises exposing the material to ozone so as to substantially increase catalytic activity of the material comprises obtaining an electrode charge transfer resistance that is less than about 5 ohms·cm² and at a light transmittance at 550 nm of at least 88%. The catalytic activity can be represented by a charge transfer resistance, $R_{CT}$, which in certain examples can range (after ozone-treatment) between about 1 $\Omega cm^2$ and about 100 $\Omega cm^2$, depending on the thickness of the ozone-exposed region of the catalytic carbon cathode electrode 504 and the duration of the ozone treatment, such as described above.

Figure 7:
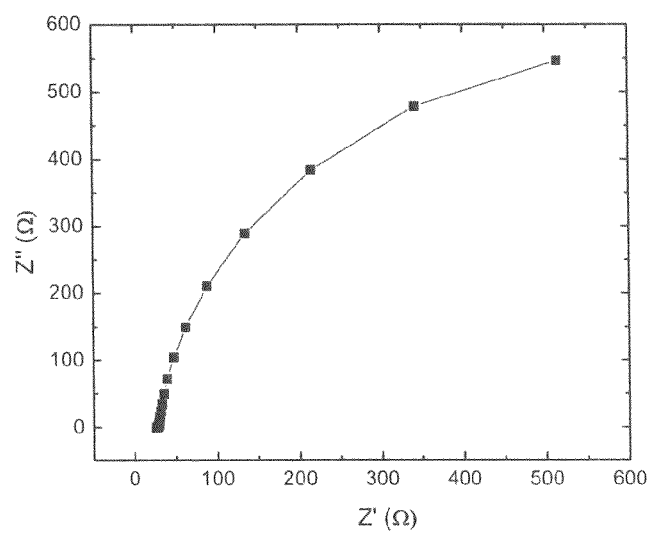
FIG. 7 is an example of a Nyquist plot showing an example of electrochemical impedance spectroscopy (EIS) results for an example of glass substrate coated with F:SNO2.

FIG. 7 is an example of a Nyquist plot showing an example of electrochemical impedance spectroscopy (EIS) results for an example of glass substrate coated with F:SNO2. High impedance indicates poor catalysis of triiodide reduction.

Figure 8:
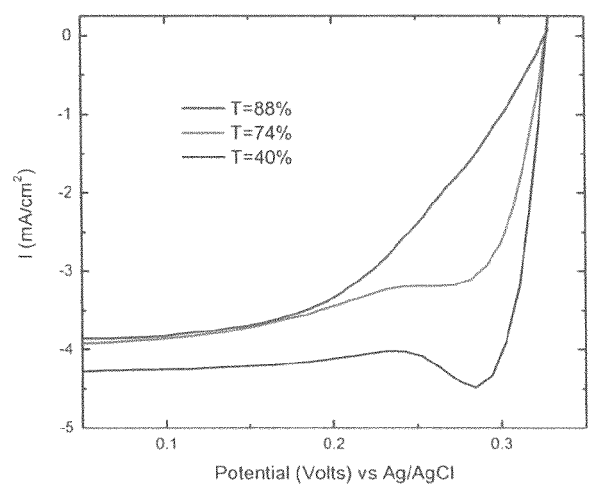
FIG. 8 is an example of a graph of current vs. voltage curves for an example of airbrushed films (not ozone treated) with varied CNT loading.

FIG. 8 is an example of a graph of current vs. voltage curves for an example of airbrushed films (not ozone treated) with varied CNT loading. In the example of FIG. 8, the scan rate is 5 mV/s. The letter T represents the light transmittance at 550 nm, measured by UV-visible spectroscopy. Without being bound by theory, it is believed that the observed peaks in the less transparent or thicker samples are due to transient mass transfer.

Table 2 is an example of a table with light transmittance data vs. capacitance data.

TABLE 2

Light Transmittance vs. Capacitance

| % Transmittance at 550 nm | Double layer capacitance ($\mu F/cm^2$) |
|---|---|
| 88 | 13 |
| 74 | 22 |
| 40 | 115 |

In Table 2, the data shows that the double layer capacitance (C) increases with increasing carbon nanotube loading, such as due to an increase in active surface area. Nyquist plots were fitted with the equivalent circuit shown in FIG. 2, and the capacitance values are shown here.

Figure 9:
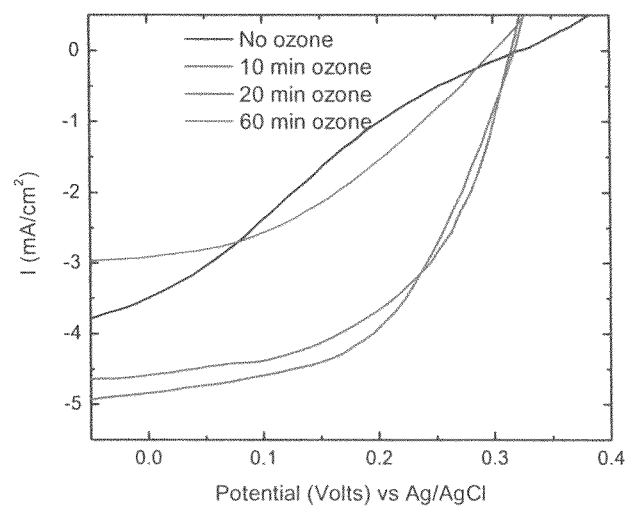
FIG. 9 is an example of current vs. voltage graph, showing current-voltage curves for an example of carbon nanotube films treated by ozone in aqueous solution.

FIG. 9 is an example of current vs. voltage graph, showing current-voltage curves for an example of carbon nanotube films treated by ozone in aqueous solution. In this example, the scan rate was 5 mV/s.

Figure 10:
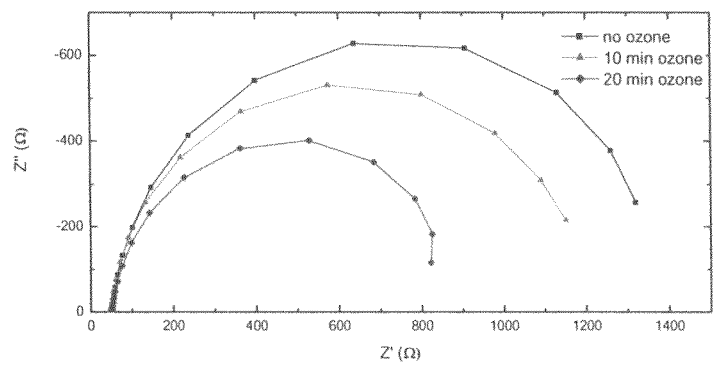
FIG. 10 shows an example of a Nyquist plot for a transparent carbon nanotube film treated by ozone in acetonitrile ($CH_3CN$).

FIG. 10 shows an example of a Nyquist plot for a transparent carbon nanotube film treated by ozone in acetonitrile ($CH_3CN$). In the example of FIG. 10, $R_{CT}$ decreases with ozone treatment up to 20 minutes. The frequency range was 0.1 to 100,000 Hz, however high frequency points below the x-axis are not shown in FIG. 10.

Figure 11:
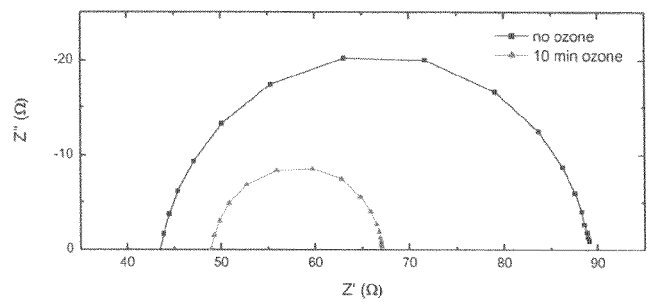
FIG. 11 shows an example of a Nyquist plot for an example of a graphite film in an aqueous solution with ozone treatment.

FIG. 11 shows an example of a Nyquist plot for an example of a graphite film in an aqueous solution with ozone treatment. In the example of FIG. 11, $R_{CT}$ decreases with ozone treatment of 10 minutes. In this example, the frequency range was 0.1 to 100,000 Hz, however high frequency points below the x-axis are not in FIG. 11.

Figure 12:
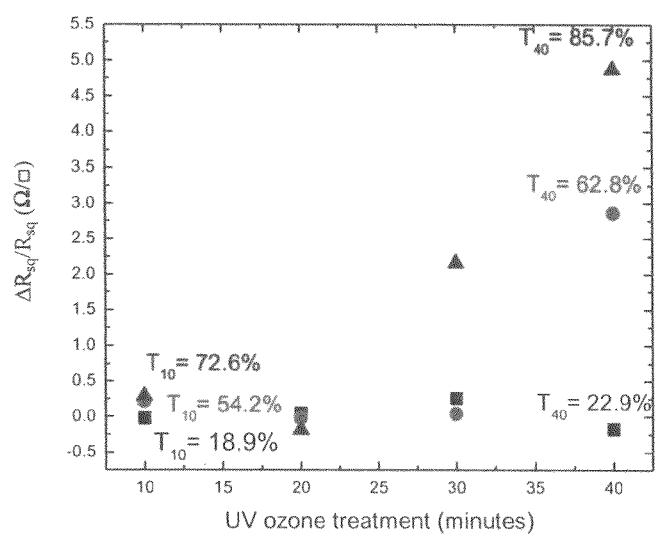
FIG. 12 is a graph illustrating a change in sheet resistance and light transmittance with ozone treatment.

FIG. 12 is a graph illustrating a change in sheet resistance and light transmittance with ozone treatment. More particularly, the example of FIG. 12 shows $\Delta R_{sq}/R_{sq}$ as a function of ozone treatment. In this example, sheet resistance measurements were made with a four-point probe. Little change is observed in all samples after 10 and 20 minutes of exposure. For longer exposures, thinner samples lose conductivity more rapidly than the thicker samples. In the example of FIG. 12, $T_{10}$ indicates the percent light transmittance after 10 minutes of ozone treatment and $T_{40}$ indicates the percent light transmittance after 40 minutes of ozone treatment.

Figure 13:
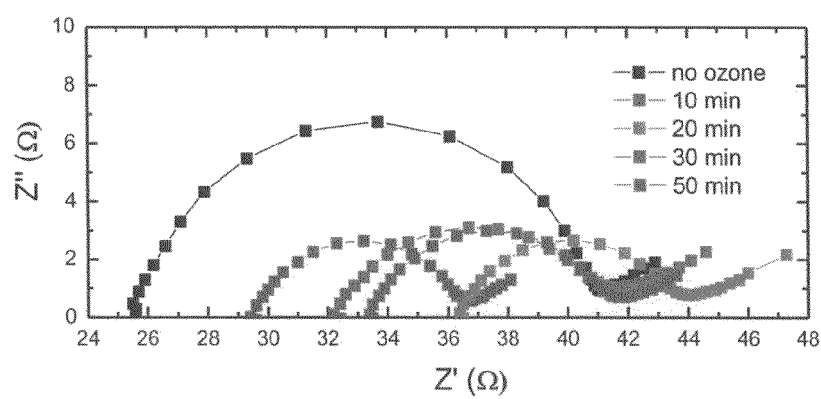
FIG. 13 is an example of a Nyquist plot for an example of an ultra-pure CNT direct transfer film.

FIG. 13 is an example of a Nyquist plot for an example of an ultra-pure CNT direct transfer film. In this example, $R_{CT}$ decreases with ozone treatment of 10 minutes and 20 minutes. The frequency range was 0.1 to 100,000 Hz, however high frequency points below the x-axis are not shown in FIG. 13.

Additional Notes

The above detailed description includes references to the accompanying drawings, which form a part of the detailed description. The drawings show, by way of illustration, specific embodiments in which the invention can be practiced.These embodiments are also referred to herein as "examples." Such examples can include elements in addition to those shown and described. However, the present inventors also contemplate examples in which only those elements shown and described are provided.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code may be tangibly stored on one or more volatile or non-volatile computer-readable media during execution or at other times. These computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A method comprising:
providing a material comprising carbon nanotubes;
exposing the material to ozone for about 1 minute to about 50 minutes to form an ozone-exposed material; and
providing an electrochemical device comprising a cathode comprising a substantially transparent film comprising the ozone-exposed material, wherein the cathode does not include a platinum catalyst, wherein the film has a transmittance at about 550 nm of about 70% to about 98%;
wherein the exposing the material to ozone increases the surface defect density of the material sufficiently such that the catalytic activity, as measured as (1/charge transfer resistance), of the cathode comprising the ozone-exposed material is at least about 1.5 times greater than the catalytic activity, as measured as (1/charge transfer resistance), of a corresponding cathode comprising the material before ozone exposure.

2. The method of claim 1, wherein the cathode comprises a working electrode cathode in the electrochemical device, such that the electrochemical device is configured to use the catalytic activity of the working electrode cathode in an electrochemical reaction.

3. The method of claim 1, wherein forming the substantially transparent film comprising carbon nanotubes comprises depositing carbon nanotubes on a transparent substrate.

4. The method of claim 1, wherein exposing the material to ozone comprises exposing the material to ozone for a duration of between about 1 minute and about 30 minutes.

5. The method of claim 1, wherein treating the material with ozone comprises exposing the material to ozone so as to substantially increase catalytic activity of the material comprises obtaining an electrode charge transfer resistance that is at least one of: less than about 22 ohms·cm$^2$ at a light transmittance at 550 nm of at least 98%; less than about 5 ohms·cm$^2$ at a light transmittance at 550 nm of at least 88%; less than about 2 ohms·cm$^2$ at a light transmittance at 550 nm of at least 82%; or less than about 1 ohms·cm$^2$ at a light transmittance at 550 nm of at least 76%.

6. The method of claim 1, wherein the electrochemical device comprises at least one of a dye-sensitized solar cell (DSSC), a battery, a fuel cell, and an electroanalytical instrument.

7. The method of claim 1, wherein exposing the material to ozone comprises generating the ozone using ultraviolet (UV) light.

8. The method of claim 1, wherein the electrochemical device comprises a dye-sensitized solar cell (DSSC).

9. The method of claim 8, wherein providing the cathode in the DSSC as a cathode comprises providing the cathode in the DSSC in place of at least one of a transparent conducting oxide (TCO) or a platinum catalyst.

10. The method of claim 1, wherein providing the cathode comprising the substantially transparent film comprises airbrushing the carbon nanotubes onto a substrate.

11. The method of claim 1, further comprising providing a dye sensitized solar cell (DSSC) comprising:
the cathode, wherein the nanotubes comprise single-walled carbon nanotubes that have been airbrushed to form the substantially transparent film;
an anode comprising $TiO_2$ nanoparticles comprising chemically adsorbed dye molecules;
an electrolyte comprising a solution of iodide and triiodide; and
wherein the anode, the cathode, and the electrolyte are configured to use the catalytic activity of the cathode in an electrochemical reaction that catalyzes the reduction of triiodide without requiring a platinum catalyst.

12. The method of claim 1, wherein the exposing the material to ozone is sufficient such that the catalytic activity, as measured by (1/charge transfer resistance), of the cathode comprising the ozone-exposed material is about 1.5 times to about 10 times greater than the catalytic activity, as measured by (1/charge transfer resistance), of a corresponding cathode comprising the material before ozone exposure.

13. The method of claim 1, wherein the electrochemical device comprises a dye sensitized solar cell (DSSC), wherein the
the ozone-treated material is provided in place of a platinum catalyst, such that the DSSC comprising the ozone-treated material has about the same or greater efficiency as a corresponding DSSC having a cathode comprising platinum in place of the cathode comprising the ozone-treated material.

14. The method of claim 1, wherein the increase in the catalytic activity of the material is such that the catalytic activity, as measured by (1/charge transfer resistance), of the cathode comprising the ozone-exposed material is at least 3 times greater than the catalytic activity, as measured by (1/charge transfer resistance), of a corresponding cathode comprising the material before ozone exposure.

15. The method of claim 1, wherein the increase in the catalytic activity of the material is such that the catalytic activity, as measured by (1/charge transfer resistance), of the cathode comprising the ozone-exposed material is at least 10 times greater than the catalytic activity, as measured by (1/charge transfer resistance), of a corresponding cathode comprising the material before ozone exposure.

16. A method comprising:
providing a material comprising carbon nanotubes;
exposing the material to ozone for about 1 minute to about 50 minutes to form an ozone-exposed material; and
providing a dye-sensitized solar cell (DSSC) comprising a cathode comprising a substantially transparent film comprising the ozone-exposed material, wherein the electrode does not include a platinum catalyst, wherein the film has a transmittance at about 550 nm of about 70% to about 98%;
wherein the exposing the material to ozone increases the surface defect density of the material sufficiently such that the catalytic activity, as measured by (1/charge transfer resistance), of the cathode comprising the ozone-exposed material is at least about 1.5 times greater than the catalytic activity, as measured by (1/charge transfer resistance), of a corresponding cathode comprising the material before ozone exposure.

* * * * *

UNITED STATES PATENT AND TRADEMARK OFFICE
CERTIFICATE OF CORRECTION

PATENT NO. : 8,901,024 B2
APPLICATION NO. : 12/221462
DATED : December 2, 2014
INVENTOR(S) : Trancik et al.

It is certified that error appears in the above-identified patent and that said Letters Patent is hereby corrected as shown below:

In the Claims

In column 18, line 59, in Claim 13, after "the", delete "¶", therefor

In column 18, line 60, in Claim 13, before "ozone-treated", delete "the", therefor Signed and Sealed this
Fourth Day of August, 2015

Michelle K. Lee
*Director of the United States Patent and Trademark Office*